(12) United States Patent
Li et al.

(10) Patent No.: US 11,203,307 B2
(45) Date of Patent: Dec. 21, 2021

(54) ELECTRONIC LICENSE PLATE AND METHOD FOR MANUFACTURING THE SAME

(71) Applicants: Chengdu BOE Optoelectronics Technology Co., Ltd., Chengdu (CN); BOE Technology Group Co., Ltd., Beijing (CN)

(72) Inventors: Ting Li, Beijing (CN); Pengcheng Zang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 315 days.

(21) Appl. No.: 16/399,234

(22) Filed: Apr. 30, 2019

(65) Prior Publication Data

US 2020/0070744 A1 Mar. 5, 2020

(30) Foreign Application Priority Data

Aug. 30, 2018 (CN) .......................... 201811002406.8

(51) Int. Cl.
*B60R 13/10* (2006.01)
*B41J 2/14* (2006.01)
(Continued)

(52) U.S. Cl.
CPC ......... *B60R 13/105* (2013.01); *B41J 2/14201* (2013.01); *H03H 9/02574* (2013.01); *H03H 9/14502* (2013.01)

(58) Field of Classification Search
CPC .......................... B60R 13/105; H03H 9/14502
See application file for complete search history.

(56) References Cited

U.S. PATENT DOCUMENTS

| 5,579,008 | A | * | 11/1996 | Hulderman | ........... | G01S 13/756 |
|---|---|---|---|---|---|---|
| | | | | | | 342/44 |
| 2003/0155415 | A1 | * | 8/2003 | Markham | .............. | G06Q 50/00 |
| | | | | | | 235/376 |

(Continued)

FOREIGN PATENT DOCUMENTS

| CN | 2171139 Y | 7/1994 |
|---|---|---|
| CN | 2511541 Y | 9/2002 |

(Continued)

OTHER PUBLICATIONS

Office Action for corresponding Chinese Application 201811002406.8 dated Jun. 12, 2020.

(Continued)

*Primary Examiner* — Gary C Hoge
(74) *Attorney, Agent, or Firm* — Arent Fox LLP; Michael Fainberg

(57) ABSTRACT

The disclosure discloses an electronic license plate and a method for manufacturing the same. The electronic license plate comprises a substrate, and a surface acoustic wave device and an electronic ink display component on the substrate; wherein the surface acoustic wave device is configured to receive information from, and transmit information to, an external device; the electronic ink display component is connected with the surface acoustic wave device, and configured to display information stored in the electronic ink display component and information received by the surface acoustic wave device.

19 Claims, 4 Drawing Sheets

(51) Int. Cl.
*H03H 9/02* (2006.01)
*H03H 9/145* (2006.01)

(56) References Cited

U.S. PATENT DOCUMENTS

| | | | | |
|---|---|---|---|---|
| 2003/0158795 A1* | 8/2003 | Markham | ............... | G06Q 10/06 |
| | | | | 705/28 |
| 2007/0195252 A1* | 8/2007 | Tsai | ...................... | G02F 1/1339 |
| | | | | 349/143 |
| 2011/0078933 A1* | 4/2011 | Lukawitz | ................. | B60Q 1/56 |
| | | | | 40/204 |
| 2013/0258447 A1* | 10/2013 | Wu | ......................... | B32B 38/00 |
| | | | | 359/296 |
| 2017/0293832 A1* | 10/2017 | Pai | ................... | G06K 19/07758 |
| 2017/0337854 A1 | 11/2017 | Mehmet | | |
| 2017/0359911 A1* | 12/2017 | Hayk | ................... | H05K 5/0221 |

FOREIGN PATENT DOCUMENTS

| | | |
|---|---|---|
| CN | 201556235 U | 8/2010 |
| CN | 102663466 A | 9/2012 |
| CN | 202548892 U | 11/2012 |
| CN | 202995781 U | 6/2013 |
| CN | 204172817 U | 2/2015 |
| CN | 204659630 U | 9/2015 |
| CN | 107428312 A | 12/2017 |
| EP | 0651344 B1 | 5/1995 |

OTHER PUBLICATIONS

Office Action for corresponding Chinese Application 201811002406.8 dated Dec. 4, 2019.

* cited by examiner

ELECTRONIC LICENSE PLATE AND METHOD FOR MANUFACTURING THE SAME

CROSS-REFERENCE TO RELATED APPLICATION

This application claims priority to Chinese Patent Application No. 201811002406.8, filed on Aug. 30, 2018, the content of which is incorporated by reference in the entirety.

TECHNICAL FIELD

This disclosure relates to the field of electronic license plates, and particularly to an electronic license plate and a method for manufacturing the same.

DESCRIPTION OF THE RELATED ART

An electronic license plate, in general terms, is an "identity card of a vehicle", and may include an electronic chip and store therein information of the vehicle, including a license plate number, insurance information, annual inspection information, and the like. During a high-speed running process, the time spent by the vehicle for passing through a radio frequency read-write range becomes shorter, and due to a blind zone effect of electromagnetic field, the read-write effect may be different. Thus, in the related art, since the electronic license plate generally adopts a principle of electromagnetic field, when the vehicle runs at a high speed, the identification rate is relatively low, and only the stored information can be received.

SUMMARY

Embodiments of the disclosure provide an electronic license plate and a method for manufacturing the same.

In an aspect, the embodiments of the disclosure provide an electronic license plate including a license plate body, wherein the license plate body includes: a substrate; and a surface acoustic wave device and an electronic ink display component on the substrate; wherein the surface acoustic wave device is configured to receive information from, and transmit information to, an external device; and the electronic ink display component is connected with the surface acoustic wave device, and configured to display information stored in the electronic ink display component and information received by the surface acoustic wave device.

In some embodiments, the surface acoustic wave device includes a piezoelectric layer on a side surface of the substrate, an encoding-reflecting grating, an inter-digital transducer and an antenna on a side of the piezoelectric layer facing away from the substrate; wherein the inter-digital transducer is connected with the antenna.

In some embodiments, the inter-digital transducer is configured to convert an electrical signal received by the antenna into an acoustic wave signal to be transmitted to the encoding-reflecting grating along the piezoelectric film, and to convert an acoustic wave signal reflected by the encoding-reflecting grating into an electrical signal to be transmitted to the antenna for transmission; and the encoding-reflecting grating is configured to encode and reflect the acoustic wave signal converted by the inter-digital transducer.

In some embodiments, the surface acoustic wave device further includes a control circuit surrounding the piezoelectric layer and connected with the electronic ink display component, wherein the control circuit is configured to control the electronic ink display component to display according to the information stored in the electronic ink display component and the information received by the surface acoustic wave device.

In some embodiments, the electronic ink display component includes one electronic ink layer on a side of the substrate facing away from the surface acoustic wave device.

In some embodiments, the electronic ink display component includes two electronic ink layers on two sides of the substrate, respectively.

In some embodiments, an orthographic projection of one of the two electronic ink layers, which is on a same side of the substrate as the surface acoustic wave device, onto the substrate does not overlap with an orthographic projection of the surface acoustic wave device onto the substrate.

In some embodiments, each electronic ink layer includes an electronic ink solution or an electronic ink film.

In some embodiments, the electronic ink display component further includes a protective layer on a side surface of each electronic ink layer facing away from the substrate.

In some embodiments, a sealant is arranged at an edge of each electronic ink layer to seal each electronic ink layer between the substrate and a corresponding protective layer.

In some embodiments, the electronic ink display component further includes: a plurality of thin film transistors arranged in an array and a plurality of pixel electrodes, between the substrate and each electronic ink layer; where each of the plurality of thin film transistors includes a gate, a semiconductor layer, and a source-and-drain arranged on a corresponding side of the substrate in that order.

In some embodiments, the piezoelectric layer includes a piezoelectric film, a piezoelectric single crystal, or a piezoelectric ceramic.

In some embodiments, the piezoelectric film includes a zinc oxide (ZnO) film, an aluminum nitride (AlN) film, or a polyvinylidene fluoride (PVDF) film.

In some embodiments, the substrate includes a glass substrate, or a flexible plastic substrate.

In another aspect, the embodiments of the disclosure further provide a method for manufacturing the electronic license plate according to the embodiments of the disclosure, the method including: providing the substrate; and arranging the surface acoustic wave device and the electronic ink display component on the substrate.

In some embodiments, the surface acoustic wave device includes a piezoelectric layer, an encoding-reflecting grating, an inter-digital transducer and an antenna; the electronic ink display component includes one or two electronic ink layers; arranging the surface acoustic wave device and the electronic ink display component on the substrate includes: forming the piezoelectric layer on a side of the substrate by coating a piezoelectric material thereon; forming metal electrodes of the antenna, the inter-digital transducer, a part of the encoding-reflecting grating and a part of a control circuit on a side of the piezoelectric layer facing away from the substrate; forming a metal gate of the electronic ink display component on a side of the substrate facing away from the piezoelectric layer or on two sides of the substrate; forming an amorphous silicon pattern of the electronic ink display component on the side of the substrate facing away from the piezoelectric layer or on the two sides of the substrate; forming metal electrodes of another part of the encoding-reflecting grating and another part of the control circuit on the side of the piezoelectric layer facing away from the substrate; forming a source and a metal drain of the electronic ink display component on the side of the substrate facing away from the piezoelectric layer or on the two sides of the substrate; forming transparent electrodes of the antenna, the inter-digital transducer, the encoding-reflecting grating and the control circuit on the side of the piezoelectric layer facing away from the substrate; and forming a pixel electrode of the electronic ink display component on the side of the substrate facing away from the piezoelectric layer or on the two sides of the substrate.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
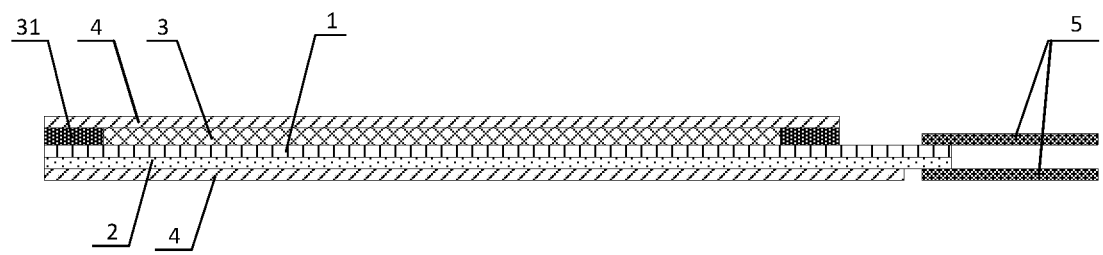
FIG. 1 is a schematic structural diagram of an electronic license plate according to the embodiments of the disclosure.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

As illustrated in FIG. 1 to FIG. 6, the embodiments of the disclosure provide an electronic license plate including a substrate 1, and a surface acoustic wave device 2 and an electronic ink display component on the substrate 1; where the surface acoustic wave device 2 is configured to receive information from, and transmit information to, an external device; and the electronic ink display component is connected with the surface acoustic wave device 2, and configured to display information stored in the electronic ink display component and information received by the surface acoustic wave device 2.

In the related art, since an electronic license plate is generally identified using an electromagnetic principle, and an electromagnetic field shadow is usually formed during the wireless communication, the transmission of electromagnetic signals will be affected and thereby identification of the electronic license plate when the vehicle runs at a high speed will be affected. Meanwhile, the electronic license plate that includes a display device as provided in the related art cannot display relevant information of the vehicle when the power is turned off, which will further cause inconvenience to detection of the vehicle and the driver.

In the embodiments of the disclosure, a surface acoustic wave technology is adopted by the surface acoustic wave device 2 to realize transmission between acoustic wave signals and electronic signals in the electronic license plate. The surface acoustic wave device is passive and has a strong capability in resisting electromagnetic interference, thus certain unique advantages can be obtained by taking the surface acoustic wave device as an electronic identification tag of the electronic license plate, that is, it has a small size, light weight, large and reliable reading range, and furthermore, it is easy for performing code converting, and able to be accurately identified by a detection device even when the vehicle runs at a high speed; meanwhile, the surface acoustic wave device 2 also has functions of transmitting and receiving signals.

Further, in the embodiments of the disclosure, characteristics of electronic ink are used by the electronic ink display component in the electronic license plate to display the relevant information of the vehicle stored therein and information transmitted from the surface acoustic wave device 2, so that the relevant information of the vehicle may also be displayed even when the power is off, which is convenient for the external device to identify the electronic license plate. Stated otherwise, in the embodiments of the disclosure, the electronic ink display component not only can be used for displaying and thus enabling the external device to identify, the license plate number, the insurance information, the annual inspection information, and the like of the relevant information of the vehicle as stored therein, but also can be used for displaying information, such as weather conditions, road conditions and the like, as received by the surface acoustic wave device 2.

It shall be noted that, when the electronic ink display component in the embodiments of the disclosure is used to display the relevant information of the vehicle, if the surface acoustic wave device 2 fails to work normally, the relevant information of the vehicle displayed by the electronic ink display component will be collected by the external device in the form of an image; where the relevant information displayed by the electronic ink display component not only includes license plate information of the vehicle, but also includes other information of the vehicle, such as, annual inspection information, insurance information, maintenance status information, driver contact information, etc.

Figure 5:
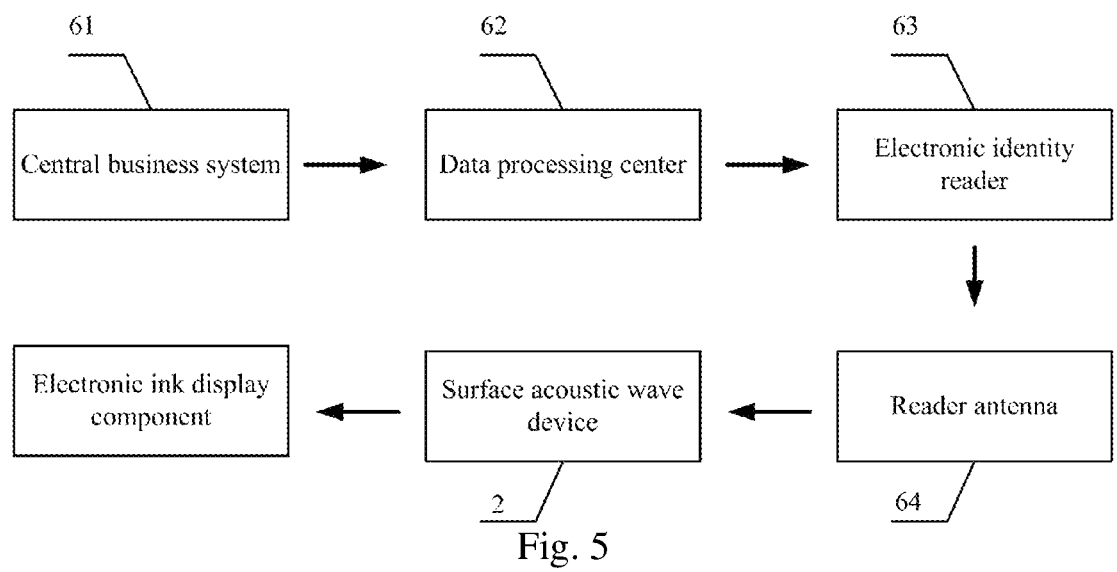
FIG. 5 is a schematic diagram of signal transmission of an electronic license plate merely storing displayed information according to the embodiments of the disclosure.
Figure 6:
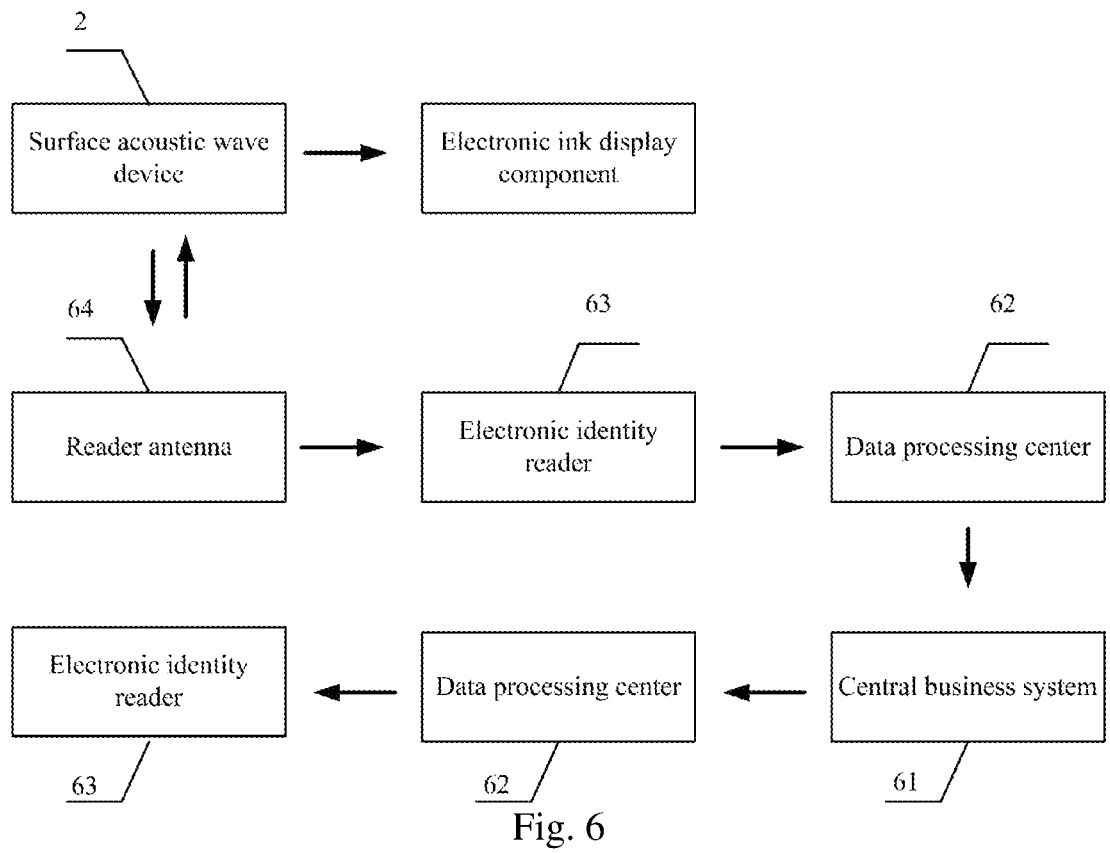
FIG. 6 is a schematic diagram of signal transmission of an electronic license plate that simultaneously displays, receives and sends signals according to the embodiments of the disclosure.

In some embodiments, in a scenario or environment where information collection is required for the vehicle, the external device may include a central business system 61, a data processing center 62, an electronic identity reader 63 and a reader antenna 64. In some embodiments, FIG. 5 and FIG. 6 illustrate operating processes of the electronic license plate according to the embodiments of the disclosure; where FIG. 5 illustrates a process in which the electronic license plate simply receives and displays information transmitted by the external device, and as illustrated, signals of the external device sequentially pass through the central business system 61, the data processing center 62 and the electronic identity reader 63 and then are transmitted by the reader antenna 64, after that, the surface acoustic wave device 2 of the electronic license plate receives and transmits the aforesaid signals to the electronic ink display component for display, so that the driver can understand the driving situation in various aspects. Further, FIG. 6 illustrates a process in which the electronic license plate transmits information and receives feedback information of the external device simultaneously, and as illustrated, after the surface acoustic wave device 2 transmits vehicle information stored in the electronic ink display component, the reader antenna 64 in the external device receives the information and feeds back the information to the central business system 61 via the electronic identity reader 63 and the data processing center 62 sequentially, then information that needs to be fed back to the electronic license plate by the central business system 61 passes through the central business system 61, the data processing center 62 and the electronic identity reader 63 sequentially, and then is transmitted by the reader antenna 64, and after that, the surface acoustic wave device 2 of the electronic license plate receives and transmits the aforesaid information to the electronic ink display component for display.

In the electronic license plate according to the embodiments of the disclosure, due to the transmission characteristics of the surface acoustic wave device 2, the vehicle can be accurately identified by the external device and meanwhile exchange information with the external device in the high-speed running state; and the electronic ink display component can maintain a normal display state when the surface acoustic wave device 2 fails to work normally, thereby facilitating detection by the external device. In addition, the electronic ink display component and the surface acoustic wave device 2 are arranged on the same substrate 1, so that a simple process and a convenient manufacture can be achieved. Therefore, the electronic license plate provided by the embodiments of the disclosure can effectively improve the possibility of the electronic license plate being identified in a high-speed state, and meanwhile has the functions of information displaying and information interaction, thereby reducing the risk of violations by the driver.

It shall be noted that, the substrate 1 in the embodiments of the disclosure can be a glass substrate, a flexible plastic substrate or the like, which will not be limited herein.

Figure 3:
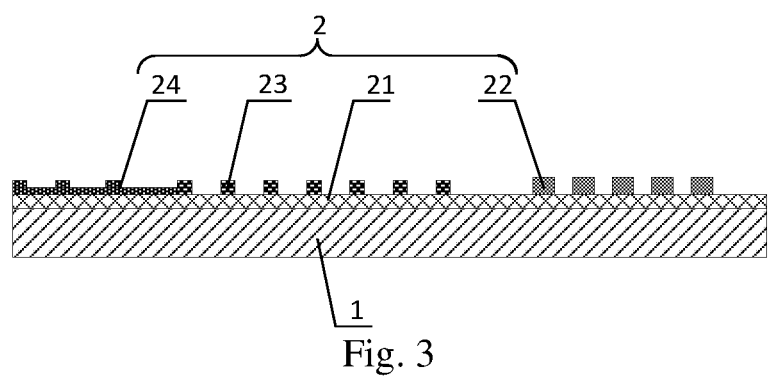
FIG. 3 is a schematic structural diagram of a surface acoustic wave device in the electronic license plate arranged on a substrate according to the embodiments of the disclosure.
Figure 4:
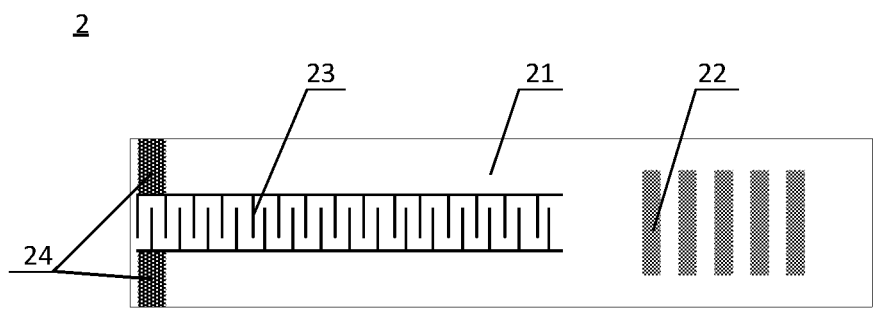
FIG. 4 is a schematic structural diagram of positions of respective components of the surface acoustic wave device in the electronic license plate according to the embodiments of the disclosure.

In some embodiments, as illustrated in FIG. 3 and FIG. 4, the surface acoustic wave device 2 includes a piezoelectric layer 21, an encoding-reflecting grating 22, an inter-digital transducer 23 and an antenna 24; the piezoelectric layer 21 is on a side surface of the substrate 1; and the encoding-reflecting grating 22, the inter-digital transducer 23, and the antenna 24 are on a side, facing away from the substrate 1, of the piezoelectric layer 21. Where, the inter-digital transducer 23 is connected with the antenna 24, and configured to convert an electrical signal received by the antenna 24 into an acoustic wave signal, and convert a received acoustic wave signal into an electrical signal to be transmitted by the antenna 24; and the encoding-reflecting grating 22 is configured to encode and reflect the acoustic wave signal converted by the inter-digital transducer 23.

In some embodiments, as a base substrate for the entire surface acoustic wave device 2, the piezoelectric layer 21 includes a piezoelectric film, a piezoelectric single crystal, or a piezoelectric ceramic, etc. Where, when the piezoelectric layer 21 includes the piezoelectric film, it can include any one of a PVDF (polyvinylidene fluoride) film, a ZnO (zinc oxide) film, or an MN (aluminum nitride) film.

In some embodiments, as illustrated in FIG. 3, the encoding-reflecting grating 22, the inter-digital transducer 23 and the antenna 24 are arranged on the side, facing away from the substrate 1, of the piezoelectric layer 21. Where, the antenna 24 is configured to exchange information with the external device, that is, the antenna 24 is used for receiving a signal sent by the external device or transmitting a signal to be detected by the external device, thus, it can realize functions of receiving and transmitting signals simultaneously; the inter-digital transducer 23 is configured to convert an electrical signal received by the antenna 24 into an acoustic wave signal, and to transmit the acoustic wave signal to the encoding-reflecting grating 22 along the piezoelectric layer 21, where the acoustic wave signal is then reflected by the encoding-reflecting grating 22 and reaches the inter-digital transducer 23 again; and the inter-digital transducer 23 is further configured to re-convert the acoustic wave signal into an electrical signal, and transmits the electrical signal to the antenna 24; where the electrical signal is then transmitted by the antenna 24 to an outside so as to be detected by the external device.

In some embodiments, the surface acoustic wave device 2 further includes a control circuit surrounding the piezoelectric layer 21 and connected with the electronic ink display component, where the control circuit is configured to control the electronic ink display component to display according to the information stored in the electronic ink display component and the information received by the surface acoustic wave device 2.

According to the above embodiments of the disclosure, the electronic ink display component can display not only the relevant information of the vehicle as stored therein but also the information received by the surface acoustic wave device 2. Thus, the electronic ink display component in the embodiments of the disclosure may be arranged in at least following two modes according to different requirements in usage.

The first mode is that, as illustrated in FIG. 1, the electronic ink display component according to the embodiments of the disclosure includes one electronic ink layer 3, and the electronic ink layer 3 is on a side, facing away from the surface acoustic wave device 2, of the substrate 1; where a side, facing away from the surface acoustic wave device 2, of the entire electronic license plate can be configured to be attached to an inner side of a windshield of the vehicle in operation. In this case, the electronic ink layer 3 is mainly used for displaying the relevant information of the vehicle (for example, license plate number, vehicle insurance information, etc.), so as to be convenient for the vehicle to be detected by the external device when the vehicle is in a running state.

In some embodiments, when the electronic ink display component includes one electronic ink layer 3, the one electronic ink layer 3 can alternatively be arranged on a side of the substrate 1 at which the surface acoustic wave device 2 is located, namely, the one electronic ink layer 3 can alternatively be arranged on a same side of the substrate 1 as the surface acoustic wave device 2, thereby layers made of a same material of the electronic ink display component and the surface acoustic wave device 2 can be fabricated in a same layer via a same process, which will facilitate the fabrication of the electronic license plate. Further, when the one electronic ink layer 3 and the surface acoustic wave device 2 are arranged on the same side of the substrate 1, an orthographic projection of the electronic ink layer 3 onto the substrate 1 does not overlap with an orthographic projection of the surface acoustic wave device 2 onto the substrate 1. In addition, it shall be noted that, in order to obtain a product with a narrow border and increase the utilization of the substrate, the one electronic ink layer 3 and the surface acoustic wave device 2 are generally arranged on two sides of the substrate 1, respectively.

Figure 2:
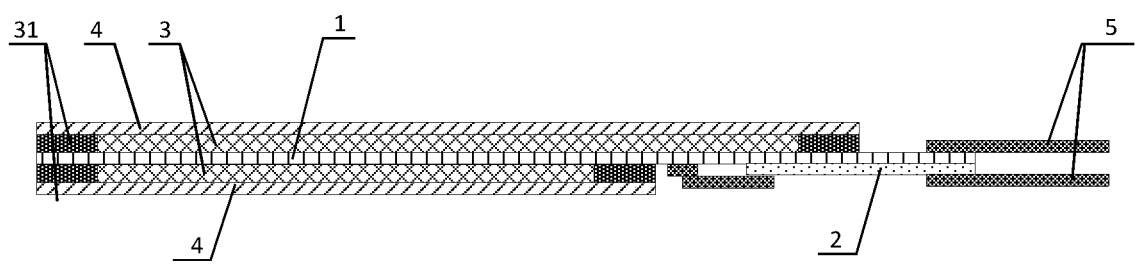
FIG. 2 is another schematic structural diagram of the electronic license plate according to the embodiments of the disclosure.

The second mode is that, as illustrated in FIG. 2, the electronic ink display component according to the embodiments of the disclosure includes two electronic ink layers 3, and the two electronic ink layers 3 are on two sides of the substrate 1, respectively. In operation, the side, facing away from the surface acoustic wave device 2, of the entire electronic license plate can be configured to be attached to the inner side of the windshield of the vehicle; the electronic ink layer 3 on a side close to the windshield of the vehicle is used for displaying the relevant information of the vehicle (such as, license plate number, vehicle insurance information, maintenance status information, driver contact information, etc.), so as to be convenient for the vehicle to be detected by the external device when the vehicle is in a running state; and the electronic ink layer 3 on a side away from the windshield of the vehicle is used for displaying relevant information fed back by the external device and received by the surface acoustic wave device 2 (such as, weather conditions, road conditions, etc.).

In some embodiments, as illustrated in FIG. 2, when the electronic ink display component includes two electronic ink layers 3, an orthographic projection of one of the two electronic ink layers 3, which is on a same side of the substrate 1 as the surface acoustic wave device 2, onto the substrate 1 does not overlap with an orthographic projection of the surface acoustic wave device 2 onto the substrate 1.

In some embodiments, in the electronic license plate according to the embodiments of the disclosure, each electronic ink layer 3 can be made of an electronic ink solution or an electronic ink film, etc.

In some embodiments, the electronic license plate according to the embodiments of the disclosure further includes a protective layer 4 on a side surface of each electronic ink layer 3 facing away from the substrate 1 to protect each electronic ink layer 3. Of course, the electronic license plate can also include a protective layer 4 on a side surface of the surface acoustic wave device 2 facing away from the substrate 1 to protect the surface acoustic wave device 2, which will not be limited herein.

In some embodiments, in the electronic license plate according to the embodiments of the disclosure, a sealant 31 is arranged at an edge of each electronic ink layer 3 to seal the electronic ink layer 3 between the substrate 1 and a corresponding protective layer 4, to thereby protect the electronic ink layer 3.

In some embodiments, in the electronic license plate according to the embodiments of the disclosure, the electronic ink display component further includes: a plurality of thin film transistors arranged in an array and a plurality of pixel electrodes, between the substrate 1 and each electronic ink layer 3; where each thin film transistor includes a gate, a semiconductor layer, and a source-and-drain arranged on a corresponding side of the substrate 1 in that order.

Figure 7:
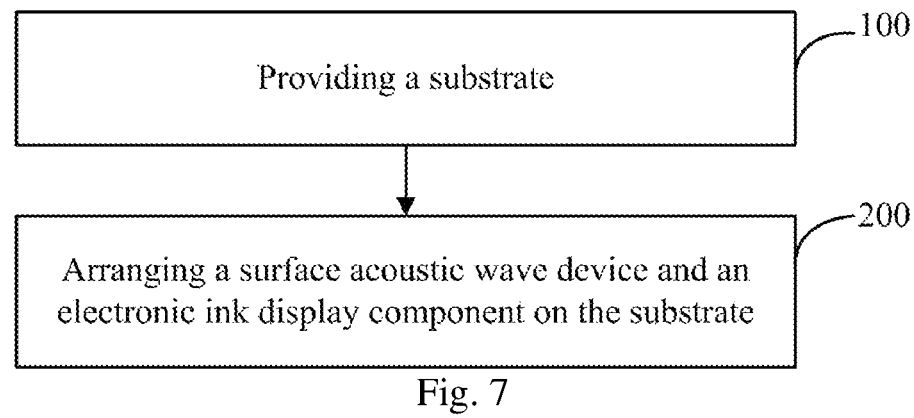
FIG. 7 is a flow chart of a method for manufacturing an electronic license plate according to the embodiments of the disclosure.

Based upon a same inventive concept, as illustrated in FIG. 7, the embodiments of the disclosure further provide a method for manufacturing the electronic license plate above according to the embodiments of the disclosure, and the method includes operations as follows.

Operation 100, providing a substrate 1.

Operation 200, arranging a surface acoustic wave device 2 and an electronic ink display component on the substrate 1.

In the method for manufacturing the electronic license plate, a new operation of manufacturing the surface acoustic wave device 2 is added in the original process of manufacturing the electronic ink display component to obtain the electronic license plate above according to the embodiments of the disclosure. Thus, the method has all the beneficial effects achieved by the above electronic license plate, and the process is simple and the operation is convenient.

Figure 8:
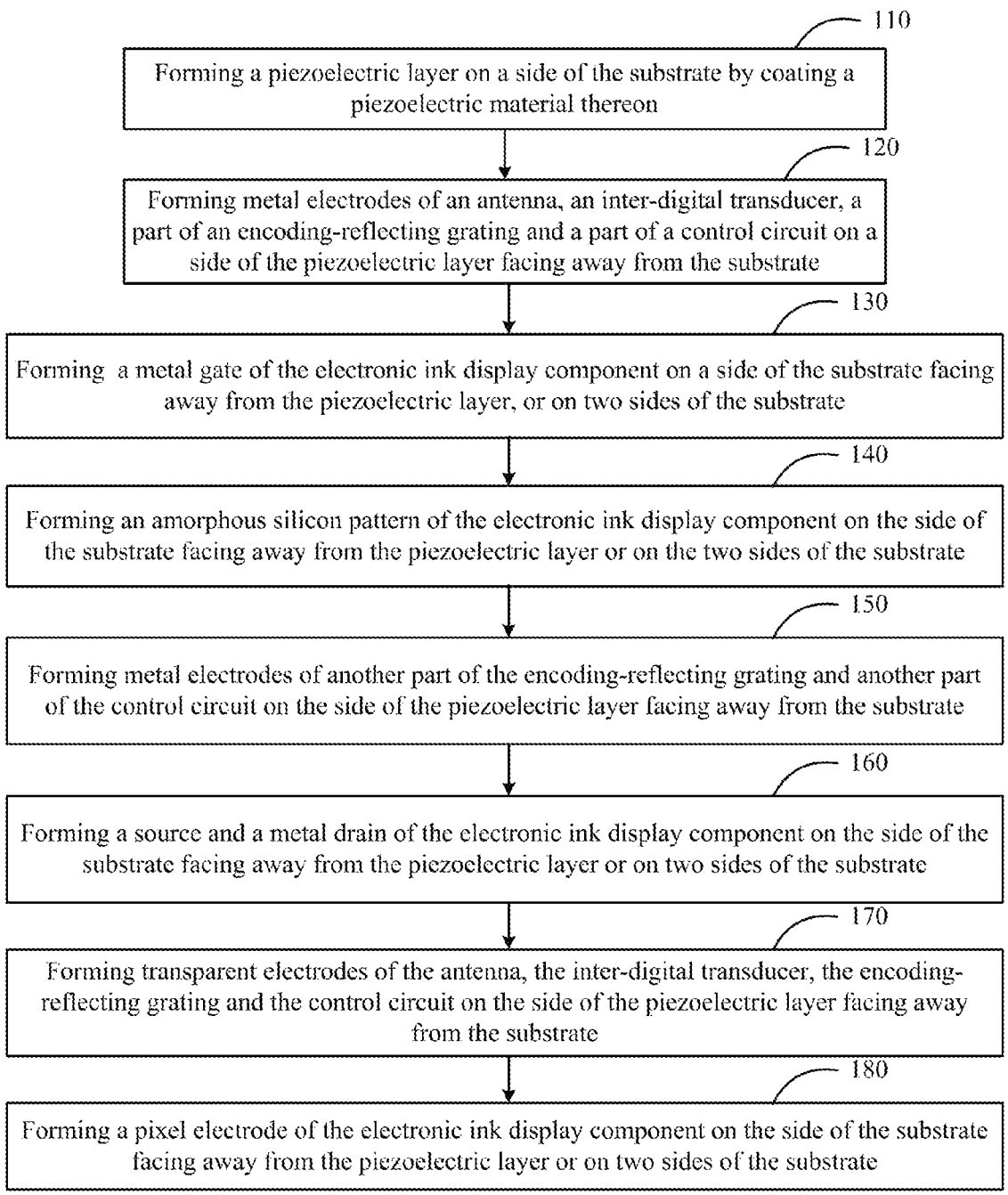
FIG. 8 is a flow chart of arranging a surface acoustic wave device and an electronic ink display component on a substrate as included in a method for manufacturing an electronic license plate according to the embodiments of the disclosure.

In some embodiments, as illustrated in FIG. 8, the operation of arranging the surface acoustic wave device 2 and the electronic ink display component on the substrate 1 includes operations as follows.

Operation 110, forming a piezoelectric layer 21 on a side of the substrate 1 by coating a piezoelectric material thereon.

Operation 120, forming metal electrodes of an antenna 24, an inter-digital transducer 23, a part of an encoding-reflecting grating and a part of a control circuit on a side, facing away from the substrate 1, of the piezoelectric layer 21 by film forming, exposing, and etching.

Operation 130, forming a metal gate of the electronic ink display component on a side, facing away from the piezoelectric layer 21, of the substrate 1 or on two sides of the substrate 1 by film forming, exposing, and etching.

Operation 140, forming an amorphous silicon pattern of the electronic ink display component on the side, facing away from the piezoelectric layer 21, of the substrate 1 or on the two sides of the substrate 1 by film forming, exposing, and etching.

Operation 150, forming metal electrodes of another part of the encoding-reflecting grating 22 and another part of the control circuit on the side, facing away from the substrate 1, of the piezoelectric layer 21 by film forming, exposing, and etching.

Operation 160, forming a source and a metal drain of the electronic ink display component on the side, facing away from the piezoelectric layer 21, of the substrate 1 or on two sides of the substrate 1 by film forming, exposing, and etching.

Operation 170, forming transparent electrodes of the antenna 24, the inter-digital transducer 23, the encoding-reflecting grating 22 and the control circuit on the side, facing away from the substrate 1, of the piezoelectric layer 21 by film forming, exposing, and etching.

Operation 180, forming a pixel electrode of the electronic ink display component on the side, facing away from the piezoelectric layer 21, of the substrate 1 or on two sides of the substrate 1 by film forming, exposing, and etching.

In some embodiments, after completion of the above operations 110 to 180, the electronic license plate can be further coated with a protective material at the side, facing away from the piezoelectric layer 21, of the substrate 1 or on the two sides of the substrate 1 to form a protective layer 4.

In some embodiments, arranging the electronic ink display component on the substrate further includes: injecting electronic ink solution into an area between the substrate 1 and the protective layer 4 to form an electronic ink layer 3. Of course, it shall be noted that, the electronic ink layer 3 can alternatively be formed by coating electronic ink solution or adhering an electronic ink film on the side of the substrate 1 facing away from the piezoelectric layer 21 or on the two sides of the substrate 1, after completion of the above operations 110 to 180 and prior to the formation of the protective layer 4, which will not be limited herein.

Further, after the electronic ink layer 3 is formed, the electronic ink display component can be packaged and a relevant flexible circuit 5 can be further formed, which will not be limited herein.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. An electronic license plate, comprising:
   a substrate; and
   a surface acoustic wave device and an electronic ink display component on the substrate;
   wherein the surface acoustic wave device is configured to receive information from, and transmit information to, an external device; and
   the electronic ink display component is connected with the surface acoustic wave device, and configured to display information stored in the electronic ink display component and information received by the surface acoustic wave device;
   wherein the surface acoustic wave device comprises:
      a piezoelectric layer on a side surface of the substrate; and
      an encoding-reflecting grating, an inter-digital transducer and an antenna on a side of the piezoelectric layer facing away from the substrate;
      wherein the inter-digital transducer is connected with the antenna.

2. The electronic license plate according to claim 1, wherein the inter-digital transducer is configured to convert an electrical signal received by the antenna into an acoustic wave signal to be transmitted to the encoding-reflecting grating along the piezoelectric film, and to convert an acoustic wave signal reflected by the encoding-reflecting grating into an electrical signal to be transmitted to the antenna for transmission; and
   the encoding-reflecting grating is configured to encode and reflect the acoustic wave signal converted by the inter-digital transducer.

3. The electronic license plate according to claim 1, wherein the surface acoustic wave device further comprises:
   a control circuit surrounding the piezoelectric layer and connected with the electronic ink display component, wherein the control circuit is configured to control the electronic ink display component to display according to the information stored in the electronic ink display component and the information received by the surface acoustic wave device.

4. The electronic license plate according to claim 1, wherein the electronic ink display component comprises one electronic ink layer on a side of the substrate facing away from the surface acoustic wave device.

5. The electronic license plate according to claim 4, wherein the electronic ink layer comprises an electronic ink solution or an electronic ink film.

6. The electronic license plate according to claim 4, wherein the electronic ink display component further comprises a protective layer on a side surface of the electronic ink layer facing away from the substrate.

7. The electronic license plate according to claim 6, wherein a sealant is arranged at an edge of the electronic ink layer to seal the electronic ink layer between the substrate and the protective layer.

8. The electronic license plate according to claim 4, wherein the electronic ink display component further comprises:
   a plurality of thin film transistors arranged in an array and a plurality of pixel electrodes, between the substrate and the electronic ink layer;
   wherein each of the plurality of thin film transistors comprises a gate, a semiconductor layer, and a source-and-drain arranged on the side of the substrate facing away from the surface acoustic wave device in that order.

9. The electronic license plate according to claim 1, wherein the electronic ink display component comprises two electronic ink layers on two sides of the substrate, respectively.

10. The electronic license plate according to claim 9, wherein an orthographic projection of one of the two electronic ink layers, which is on a same side of the substrate as the surface acoustic wave device, onto the substrate does not overlap with an orthographic projection of the surface acoustic wave device onto the substrate.

11. The electronic license plate according to claim 9, wherein each of the two electronic ink layers comprises an electronic ink solution or an electronic ink film.

12. The electronic license plate according to claim 9, wherein the electronic ink display component further comprises a protective layer on a side surface of each of the two electronic ink layers facing away from the substrate.

13. The electronic license plate according to claim 12, wherein a sealant is arranged at an edge of each of the two electronic ink layers to seal each of the two electronic ink layers between the substrate and a corresponding protective layer.

14. The electronic license plate according to claim 9, wherein the electronic ink display component further comprises:
   a plurality of thin film transistors arranged in an array and a plurality of pixel electrodes, between the substrate and each of the two electronic ink layers;
   wherein each of the plurality of thin film transistors comprises a gate, a semiconductor layer, and a source-and-drain arranged on a corresponding side of the substrate in that order.

15. The electronic license plate according to claim 1, wherein the piezoelectric layer comprises a piezoelectric film, a piezoelectric single crystal, or a piezoelectric ceramic.

16. The electronic license plate according to claim 15, wherein the piezoelectric film comprises a zinc oxide (ZnO) film, an aluminum nitride (AlN) film, or a polyvinylidene fluoride (PVDF) film.

17. The electronic license plate according to claim 1, wherein the substrate comprises a glass substrate, or a flexible plastic substrate.

18. A method for manufacturing the electronic license plate according to claim 1, comprising:
   providing the substrate; and
   arranging the surface acoustic wave device and the electronic ink display component on the substrate.

19. The method for manufacturing the electronic license plate according to claim 18, wherein the surface acoustic wave device comprises a piezoelectric layer, an encoding-reflecting grating, an inter-digital transducer and an antenna; the electronic ink display component comprises one or two electronic ink layers;
  wherein arranging the surface acoustic wave device and the electronic ink display component on the substrate comprises:
    forming the piezoelectric layer on a side of the substrate by coating a piezoelectric material thereon;
    forming metal electrodes of the antenna, the inter-digital transducer, a part of the encoding-reflecting grating and a part of a control circuit on a side of the piezoelectric layer facing away from the substrate;
    forming a metal gate of the electronic ink display component on a side of the substrate facing away from the piezoelectric layer or on two sides of the substrate;
    forming an amorphous silicon pattern of the electronic ink display component on the side of the substrate facing away from the piezoelectric layer or on the two sides of the substrate;
    forming metal electrodes of another part of the encoding-reflecting grating and another part of the control circuit on the side of the piezoelectric layer facing away from the substrate;
    forming a source and a metal drain of the electronic ink display component on the side of the substrate facing away from the piezoelectric layer or on the two sides of the substrate;
    forming transparent electrodes of the antenna, the inter-digital transducer, the encoding-reflecting grating and the control circuit on the side of the piezoelectric layer facing away from the substrate; and
    forming a pixel electrode of the electronic ink display component on the side of the substrate facing away from the piezoelectric layer or on the two sides of the substrate.

* * * * *